(12) United States Patent
Anderson et al.

(10) Patent No.: US 11,990,410 B2
(45) Date of Patent: May 21, 2024

(54) TOP VIA INTERCONNECT HAVING A LINE WITH A REDUCED BOTTOM DIMENSION

(71) Applicant: International Business Machines Corporation, Armonk, NY (US)

(72) Inventors: Brent Anderson, Jericho, VT (US); Lawrence A. Clevenger, Saratoga Springs, NY (US); Nicholas Anthony Lanzillo, Wynantskill, NY (US); Christopher J. Penny, Saratoga Springs, NY (US); Kisik Choi, Watervliet, NY (US); Robert Robison, Rexford, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 366 days.

(21) Appl. No.: 17/495,980

(22) Filed: Oct. 7, 2021

(65) Prior Publication Data

US 2022/0028785 A1     Jan. 27, 2022

Related U.S. Application Data

(62) Division of application No. 16/861,267, filed on Apr. 29, 2020, now Pat. No. 11,189,568.

(51) Int. Cl.
*H01L 23/528*     (2006.01)
*H01L 21/768*     (2006.01)
*H01L 23/522*     (2006.01)

(52) U.S. Cl.
CPC .... *H01L 23/5283* (2013.01); *H01L 21/76816* (2013.01); *H01L 21/76829* (2013.01); *H01L 21/76877* (2013.01); *H01L 23/5226* (2013.01)

(58) Field of Classification Search
CPC ............. H01L 23/5283; H01L 23/5226; H01L 21/76816; H01L 21/76829;
(Continued)

(56) References Cited

U.S. PATENT DOCUMENTS 6,245,669 B1     6/2001 Fu
6,291,334 B1     9/2001 Somekh
(Continued)

OTHER PUBLICATIONS

List of IBM Patents or Patent Applications Treated as Related; Date Filed: Oct. 7, 2021, 2 pages.
(Continued)

*Primary Examiner* — Shahed Ahmed
*Assistant Examiner* — Vicki B. Booker
(74) *Attorney, Agent, or Firm* — CANTOR COLBURN LLP; Daniel Yeates

(57) ABSTRACT

A technique relates to an integrated circuit (IC). The IC includes a conductive line formed on a conductive via, the conductive line being formed though a dielectric material. The IC includes an etch stop layer having one or more extended portions intervening between one or more edge portions of the conductive line and the conductive via, the one or more edge portions being at a periphery of the conductive line and the conductive via, the etch stop layer including a higher dielectric breakdown than the dielectric material. The one or more extended portions of the etch stop layer cause the conductive line to be formed with a bottom part having a reduced dimension than an upper part of the conductive line.

20 Claims, 11 Drawing Sheets

(58) Field of Classification Search
CPC ......... H01L 21/76877; H01L 21/76834; H01L 2221/1063
See application file for complete search history.

(56) References Cited

U.S. PATENT DOCUMENTS

| | | |
|---|---|---|
| 6,424,044 B1 | 7/2002 | Han |
| 8,611,055 B1 | 12/2013 | Pakala |
| 9,391,019 B2 | 7/2016 | Kobrinsky |
| 9,659,864 B2 | 5/2017 | Wu |
| 10,002,831 B2 | 6/2018 | Briggs |
| 10,032,643 B2 | 7/2018 | Chawla |
| 2008/0153283 A1 | 6/2008 | Abdelrahman |
| 2014/0151889 A1* | 6/2014 | Plekhanov ........ H01L 21/76834 438/692 |
| 2016/0343660 A1 | 11/2016 | Kim |
| 2018/0033727 A1* | 2/2018 | Lee .................. H01L 21/76844 |
| 2018/0061707 A1 | 3/2018 | Clevenger |
| 2018/0315653 A1 | 11/2018 | Briggs |
| 2019/0035734 A1 | 1/2019 | Ho |
| 2019/0088543 A1 | 3/2019 | Lin |
| 2019/0287848 A1* | 9/2019 | Tsai ................... H01L 23/5226 |

OTHER PUBLICATIONS

Anderson et al., "Top Via Interconnect Having a Line With a Reduced Bottom Dimension," U.S. Appl. No. 16/861,267, filed Apr. 29, 2021.

* cited by examiner

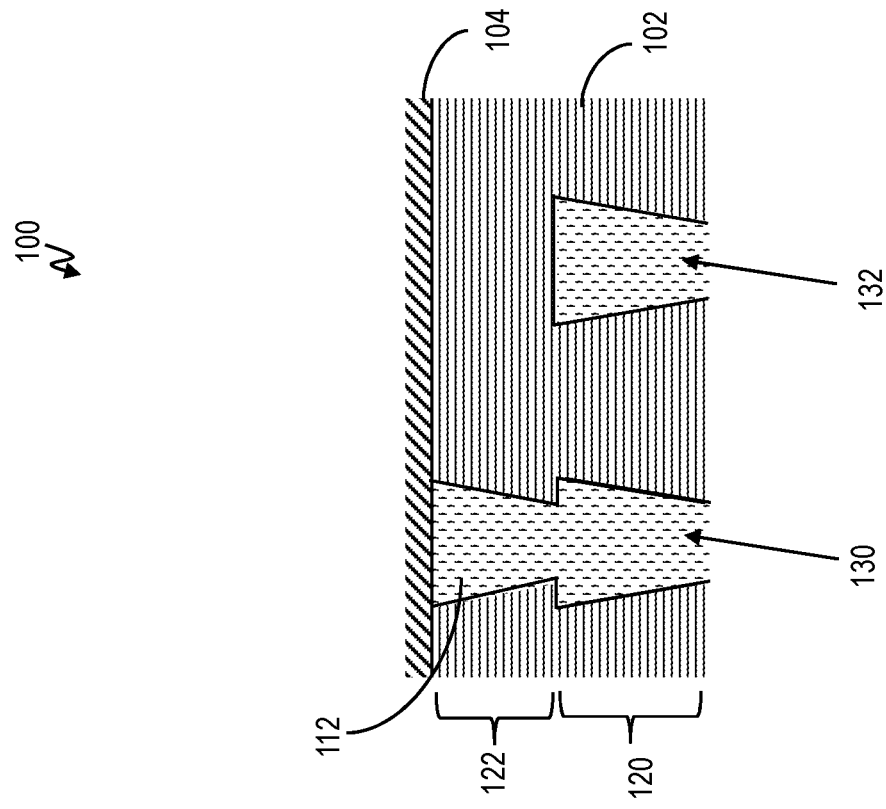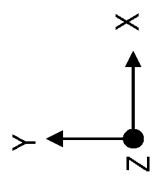

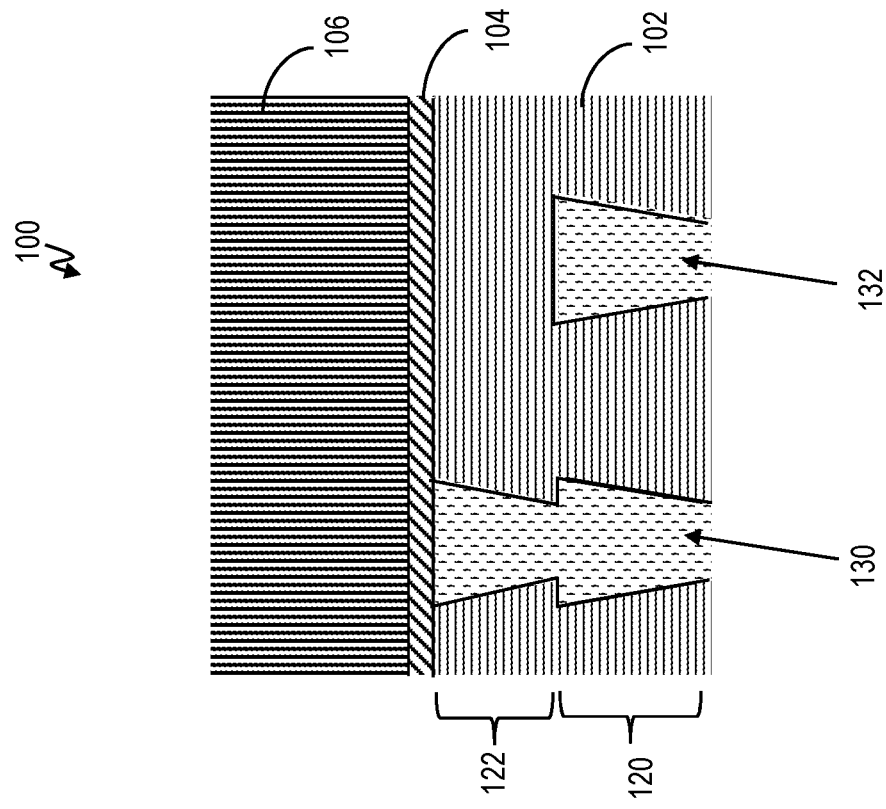
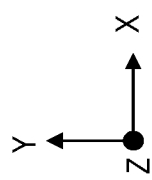

FIG. 10  1000

1002 — FORM A DIELECTRIC MATERIAL WITH AN OPENING STOPPING ON AN ETCH STOP LAYER, THE OPENING BEING ABOVE A CONDUCTIVE VIA

1004 — FORM SPACER MATERIAL IN THE OPENING TO COVER ONE OR MORE PORTIONS OF THE ETCH STOP LAYER AND PERMIT OTHER PORTIONS OF THE ETCH STOP LAYER TO REMAIN UNCOVERED

1006 — REMOVE THE OTHER PORTIONS OF THE ETCH STOP LAYER AND THE SPACER MATERIAL, THE REMOVING LEAVING AT LEAST ONE OPENING THROUGH THE ETCH STOP LAYER

1008 — FORM A CONDUCTIVE LINE ON THE CONDUCTIVE VIA, A BOTTOM PART OF THE CONDUCTIVE LINE BEING FORMED THROUGH AT LEAST ONE OPENING AT THE ONE OR MORE PORTIONS OF THE ETCH STOP LAYER AND HAVING A REDUCED DIMENSION THAN AN UPPER PART OF THE CONDUCTIVE LINE

TOP VIA INTERCONNECT HAVING A LINE WITH A REDUCED BOTTOM DIMENSION

BACKGROUND

The present invention generally relates to fabrication methods and resulting structures for integrated circuits (ICs), and more specifically, to fabrication methods and resulting structures for a top via interconnect that includes a line having a reduced bottom dimension.

ICs (also referred to as a chip or a microchip) include electronic circuits on a wafer. The wafer is a semiconductor material, such as, for example, silicon or other materials. An IC includes a large number electronic devices that form the electronic circuits on the wafer. The back-end-of-line (BEOL) is the second portion of IC fabrication where a network of vias and lines (known collectively as interconnect structures) of the IC is formed. The IC's individual devices, such as transistors, capacitors, resistors, etc. are formed in earlier layers of the IC and communicatively coupled with one another using the interconnect structures in the BEOL layers of the wafer. The BEOL layer that includes the interconnection of wiring is referred to as the metallization layer, which generally begins when the first layer of metal is deposited on the wafer. BEOL layers of the IC generally include contacts, insulating layers (dielectrics), metal levels, bonding sites for chip-to-package connections, etc.

SUMMARY

A non-limiting example of an integrated circuit (IC) includes a conductive line formed on a conductive via, the conductive line being formed though a dielectric material. The IC includes an etch stop layer including one or more extended portions intervening between one or more edge portions of the conductive line and the conductive via, the one or more edge portions being at a periphery of the conductive line and the conductive via. The etch stop layer includes a higher dielectric breakdown than the dielectric material, the one or more extended portions of the etch stop layer causing the conductive line to be formed with a bottom part having a reduced dimension than an upper part of the conductive line.

A non-limiting example of an IC includes a conductive via formed in a first dielectric material and a dielectric layer formed on the conductive via and the first dielectric material. The IC includes a conductive line including an upper part and a bottom part, the dielectric layer having one or more extended portions intervening between one or more edge portions of the conductive line and the conductive via, the one or more edge portions being at a periphery of the conductive line and the conductive via. The dielectric layer is formed to have an opening to the conductive via, and the bottom part is formed on the conductive via through the opening, the upper part being formed through a second dielectric material above the dielectric layer.

A non-limiting example of a method for forming an IC includes forming a dielectric material with an opening stopping on an etch stop layer, the opening being above a conductive via. The method includes forming spacer material in the opening to cover one or more portions of the etch stop layer and permit other portions of the etch stop layer to remain uncovered, and removing the other portions of the etch stop layer and the spacer material, the removing leaving at least one opening through the etch stop layer. Also, the method includes forming a conductive line on the conductive via, a bottom part of the conductive line being formed through the at least one opening at the one or more portions of the etch stop layer and having a reduced dimension than an upper part of the conductive line.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 2A-9 depict cross-sectional views of a portion of an IC wafer after fabrication operations for forming the IC wafer shown in FIG. 1 according to one or more embodiments of the invention, in which:

FIG. 2A depicts a cross-sectional view of a portion of the IC wafer after fabrication operations to form conductive vias according to one or more embodiments of the invention;

FIG. 3 depicts a cross-sectional view of the portion of the IC wafer after fabrication operations to form an etch stop layer according to one or more embodiments of the invention;

FIG. 4 depicts a cross-sectional view of the portion of the IC wafer after fabrication operations to form fill material according to one or more embodiments of the invention;

FIG. 5 depicts a cross-sectional view of the portion of the IC wafer after fabrication operations to form openings according to one or more embodiments of the invention;

FIG. 6 depicts a cross-sectional view of the portion of the IC wafer after fabrication operations to form temporary spacer material according to one or more embodiments of the invention;

FIG. 7 depicts a cross-sectional view of the portion of the IC wafer after fabrication operations to partially remove the etch stop layer according to one or more embodiments of the invention;

FIG. 8 depicts a cross-sectional view of the portion of the IC wafer after fabrication operations for spacer material removal according to one or more embodiments of the invention;

FIG. 9 depicts a cross-sectional view of the portion of the IC wafer after fabrication operations for metallization according to one or more embodiments of the invention; and FIG. 10 is a flow chart of a method for forming a portion of an IC wafer according to one or more embodiments of the invention.

Figure 1:
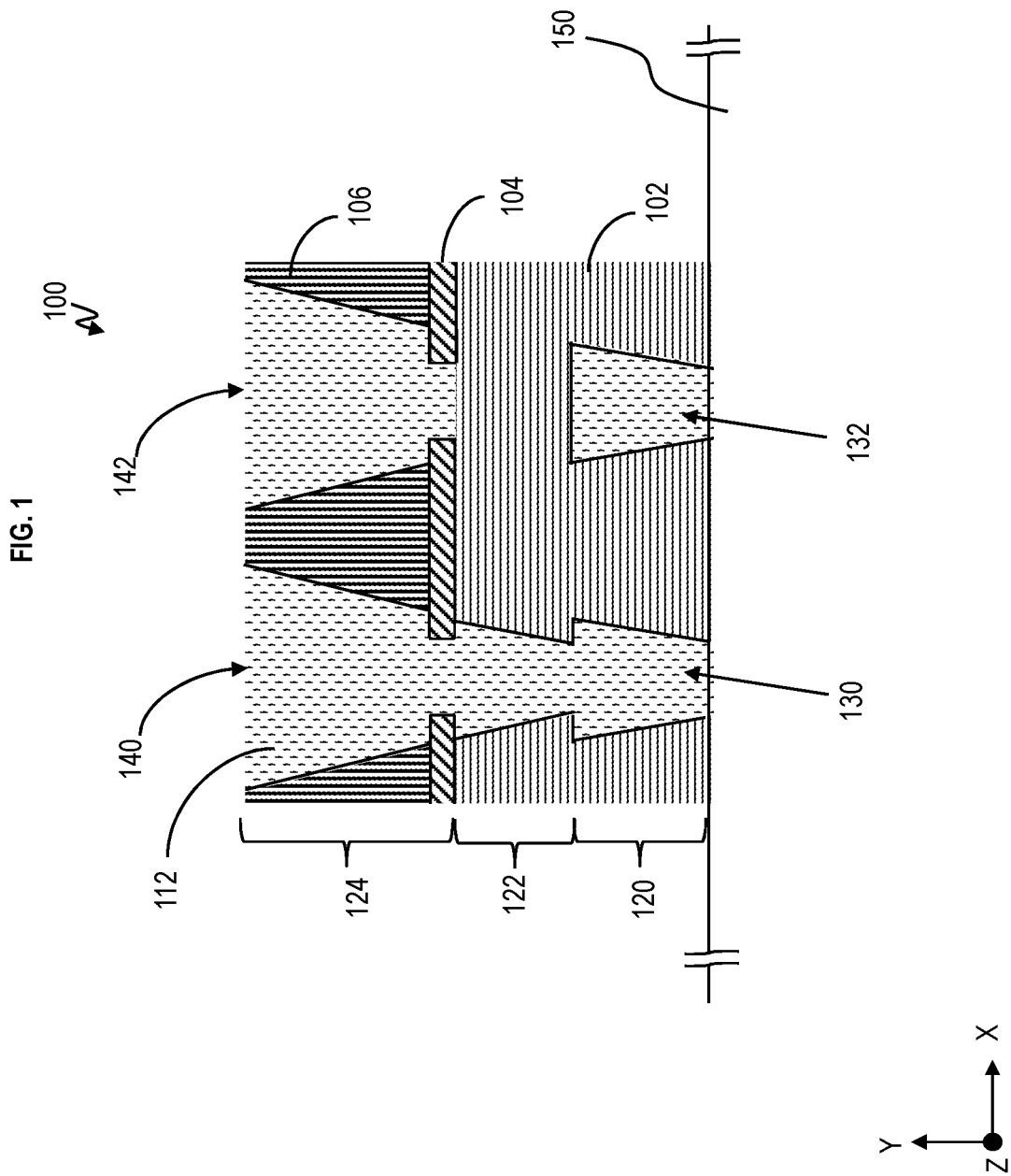
FIG. 1 depicts a cross-sectional view of a portion of an IC wafer fabricated according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified.

Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, ICs are typically formed from a large number of semiconductor devices and conductive interconnect layers. More specifically, during the first portion of chip-making (i.e., the front end of line (FEOL) stage), the individual components (transistors, capacitors, etc.) are fabricated on the wafer. The middle of line (MOL) stage follows the FEOL stage and typically includes process flows for forming the contacts and other structures that communicatively couple to active regions (e.g., gate, source, and drain) of the device element. In the BEOL stage, these device elements are connected to each other through a network of interconnect structures to distribute signals, as well as power and ground. The conductive interconnect layers formed during the BEOL stage serve as a network of pathways that transport signals throughout an IC, thereby connecting circuit components of the IC into a functioning whole and to the outside world. Because there typically is not enough room on the chip surface to create all of the necessary connections in a single layer, chip manufacturers build vertical levels of interconnects. While simpler ICs can have just a few metallization layers, complex ICs can have ten or more layers of wiring.

BEOL-stage interconnect structures that are physically close to FEOL-stage components (e.g., transistors and the like) need to be small because they attach/join to the components that are themselves very small and often closely packed together. These lower-level lines, which can be referred to as local interconnects, are usually thin and short in length. Global interconnects are higher up in the IC layer structure and travel between different blocks of the circuit. Thus, global interconnects are typically thick, long, and more widely separated local interconnects. Vertical connections between interconnect levels (or layers), called metal-filled vias, allow signals and power to be transmitted from one layer to the next. For example, a through-silicon via (TSV) is a conductive contact that passes completely through a given semiconductor wafer or die. In multi-layer IC configurations, for example, a TSV can be used to form vertical interconnections between a semiconductor device located on one layer/level of the IC and an interconnect layer located on another layer/level of the IC. These vertical interconnect structures include an appropriate metal and provide the electrical connection of the various stacked metallization layers.

Turning now to an overview of aspects of the invention, one or more embodiments of the invention use a so-called "top conductive via process" to form a top via interconnect structure, wherein the line portion of the interconnect structure is formed below the via portion of the interconnect structure. A top-via interconnect structure in accordance with aspects of the invention includes having a top via and a line with a reduced line bottom dimension or critical dimension (CD) at the line bottom of the line. The reduced line bottom dimension provides an improved time-dependent dielectric breakdown (TDDB). The line bottom is normally the primary shorting location between the line and a lower level interconnect. According to one or more embodiments of the invention, a reduced line bottom dimension (or reduced CD) decreases the potential for short circuiting which in turn allows for a higher maximum applied voltage (Vmax) for the interconnects connected to the lines. To form the line bottom of the line, a trench is formed, and temporary spacer material is deposited in the trench to protect an underlying etch stop layer. The etch stop layer is removed in areas not covered by the spacer material. After metallization is performed to form the line, the resulting line bottom dimension (or CD) of the line is smaller due to the presence of the etch stop layer confining the line bottom. The smaller trench dimension caused by the presence of the etch stop layer alleviates dielectric breakdown concerns without having to change the overall lithography and/or etch procedures.

Turning now to a more detailed description of aspects of the present invention, FIG. 1 depicts a cross-sectional view of a portion of an IC wafer 100 after fabrication operations according to one or more embodiments of the invention. The wafer 100 can be part of the back-end-of-line (BEOL), and there can be many other devices already fabricated in the substrate 150. FIG. 1 shows interconnects 130 and 132 formed in layer 102. The interconnects 130, 132 serve as conductive lines or metal lines that extend in the z-axis, for example, in and out of the page. For example, the interconnects 130, 132 are conductive vias 120 formed of conductive material 112 and can be referred to as metal layer (M1) or Mx.

The layer 102 can be a low-k dielectric material. The dielectric constant (k) of the low-k dielectric material can be equal to or less than about 2.5 in one or more embodiments of the invention. Also, the dielectric constant (k) of the low-k dielectric material can be equal to or less than about 2.7 in one or more embodiments of the invention. Further, the dielectric constant (k) of the low-k dielectric material can be equal to or less than about 3.0, 3.7, and/or 3.9 in one or more embodiments of the invention. Example materials of the low-k dielectric material can include, but are not limited to, porous SiCN, $SiO_2$, SiCOH, SiCO, and octamethylcyclotetrasiloxane (OMCTS).

In FIG. 1, a conductive via 122 is formed in layer 102 to be on top of one of the conductive vias 120 which is interconnect 130, an etch stop layer 104 is formed on the layer 102, and a fill material 106 is formed on the etch stop layer 104. Conductive via 122 can be referred to as Vx. Lines 124 (extending in the z-axis) are conductive vias formed in the fill material 106 as lines 140 and 142. The conductive via 122 and lines 124 are filled with conductive material 112. In one or more embodiments of the invention, the fill material 106 can be the same material as layer 102 or include different materials. The etch stop layer 104 can be a dielectric material different from dielectric materials of layer 102 and fill material 106. The dielectric material of etch stop layer 104 has a different selectivity than layer 102 and fill material 106, such that the etch stop layer 104 can be selectively etched. The etch stop layer 104 can be a dielectric material having a greater/higher dielectric breakdown than layer 102 and fill material 106. In other words, the etch stop layer 104 has a higher breakdown voltage than layer 102 and fill material 106. Electrical breakdown or dielectric breakdown is when current flows through an electrical insulator when the voltage applied across it exceeds the breakdown voltage.

The conductive via 122 physically and electrically connects line 140 to one of the conductive vias 120 which is interconnect 130 but not interconnect 132. A portion of the etch stop layer 104 extends over conductive via 122, which provides greater separation between any part of interconnect 132 to any part of line 140 of lines 124. Lines 124 can be referred to as M2 or metal layer 2. Further details of the shape of lines 124 are discussed herein.

Although FIG. 1 depicts two conductive vias 120 as interconnects 130, 132 and two lines 124 as lines 140, 142, it should be appreciated that more lines 124 and more conductive vias 120 having more interconnects are contemplated. The conductive material 112 of numerous interconnects (e.g., conductive vias 120) can be separated and protected from lines 124 above by the extended edges of etch stop layer 104.

Figure 2A:
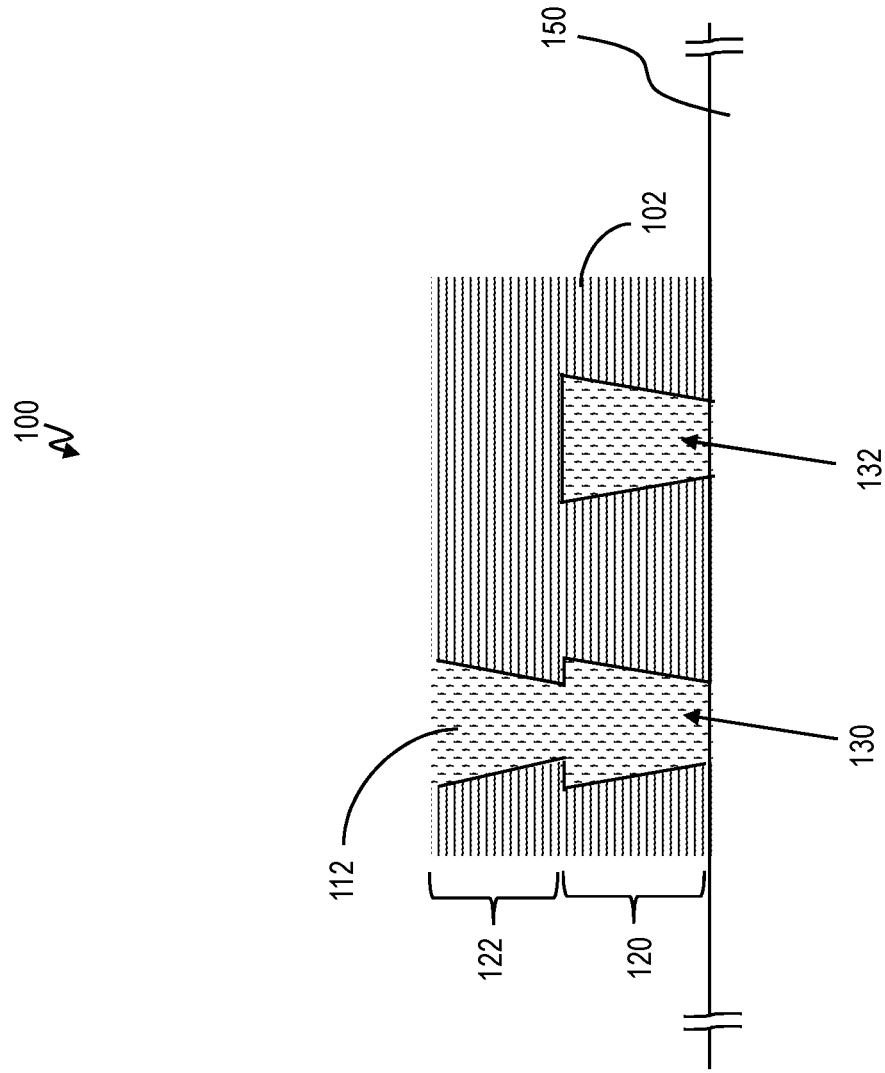
Figure 2B:
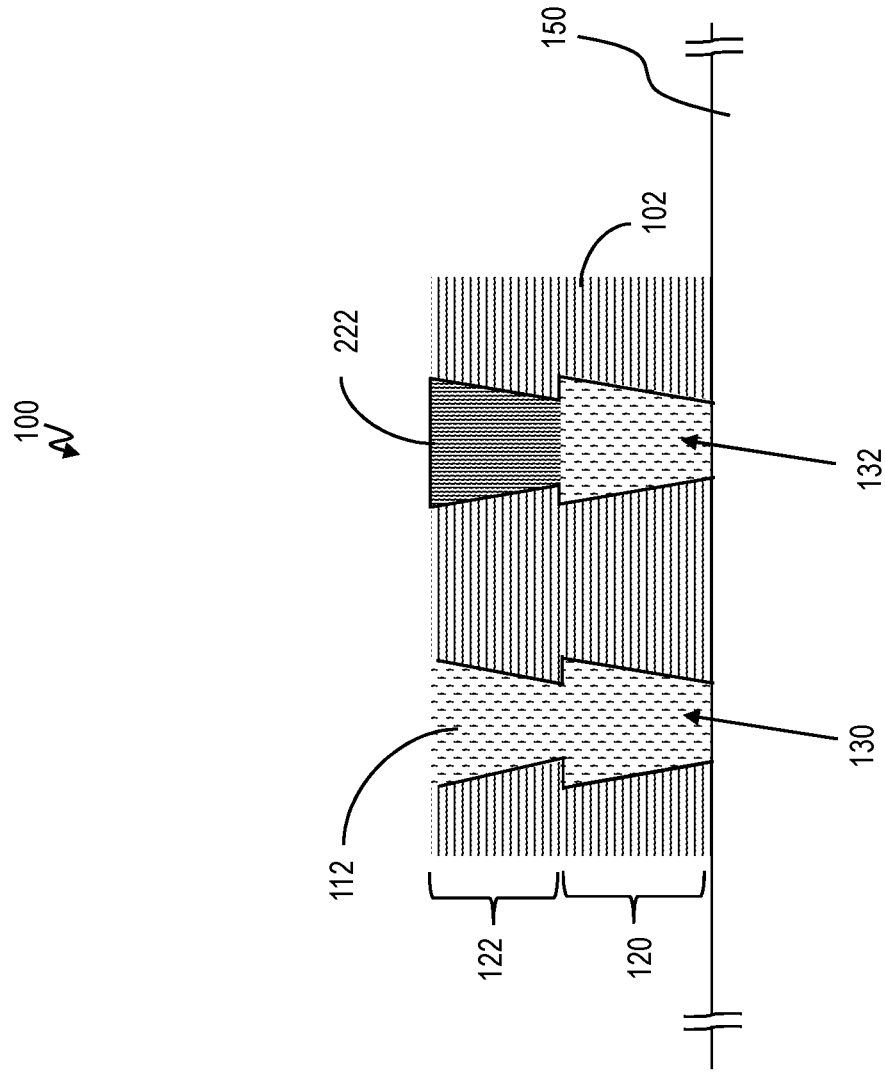
FIG. 2B depicts a cross-sectional view of a portion of the IC wafer after fabrication operations to form conductive vias using a damascene process according to one or more embodiments of the invention.

Turning to fabrication operations of forming the IC wafer 100, FIGS. 2A, 2B, and 3-9 illustrate cross-sectional views of forming the IC wafer 100. FIG. 2A depicts a cross-sectional view of the IC wafer 100 according to one or more embodiments of the invention. The IC wafer 100 can be formed using standard lithography processing. Openings are etched into layer 102 and are filled with conductive material 112 to form conductive vias 120 as shown in FIG. 2A, thereby resulting in interconnects 130 and 132. Example materials of the conductive material 112 can include, but are not limited to, copper, aluminum, tungsten, tungsten cobalt, ruthenium, nickel, etc. Chemical mechanical polishing/planarization (CMP) can be performed. There can be various options for forming conductive via 122. In one or more embodiments of the invention, an opening can be etched and filled with conductive material to form conductive via 122. FIG. 2B illustrates a damascene process.

The layer 102 can be formed on substrate 150. The substrate 150 can be the material forming the wafer and include one or more devices (not shown) such as transistors, capacitors, resistors, etc., formed thereon as understood by one skilled in the art. Although not shown for conciseness, the interconnects 130 and 132, along with other interconnects, are operatively coupled to the devices as understood by one skilled in the art.

FIG. 2B depicts a cross-sectional view of the IC wafer 100 according to one or more embodiments of the invention. FIG. 2B shows that a damascene process can be utilized to form conductive via 122. In one or more embodiments of the invention, additional material of layer 102 can be formed over interconnects 130 and 132. Openings can be formed above interconnects 130 and 132. Conductive via 122 is formed in the additional material of layer 102, for example, by filling the opening above interconnect 130 with conductive material 112. Also, a non-conductive via 222 is formed by filling the opening above interconnect 132 with a low-k dielectric material. In one or more embodiments of the invention, the opening above interconnect 132 can be back filled with material of layer 102. In one more embodiments of the invention, the opening above interconnect 132 can be filled with a dielectric material which could be the same or a different material from layer 102. In one or more embodiments of the invention, the damascene process can be utilized as shown in FIG. 2B, and further fabrication operations can proceed as discussed further herein. It should be appreciated that although a damascene process can be utilized as discussed in FIG. 2B and can be continued throughout the description, one or more embodiments of the invention are not meant to be limited to use of a damascene process. Accordingly, subsequent figures will not explicitly show non-conductive via 222 but it should be appreciated that non-conductive via 222 would be present if the damascene process is desired in one or more embodiments.

FIG. 3 depicts a cross-sectional view of the IC wafer 100 according to one or more embodiments of the invention. FIG. 3 illustrates depositing the etch stop layer 104 on the layer 102 and conductive material 112 of conductive via 122. The thickness of etch stop layer 104 can range from about 1-4 nanometers (nm). In one or more embodiments of the invention, the thickness of etch stop layer 104 can range from about 1-10 nm. More particularly, the thickness of etch stop layer 104 can range from about 1-5 nm. The etch stop layer 104 has a greater/higher dielectric breakdown voltage than layer 102 and fill material 106, as well as a different etch selectivity. Example materials of the etch stop layer 104 can include aluminum oxide (AlOx), aluminum oxynitride (AlON), etc. Another example material of the etch stop layer 104 can include aluminum nitride (AlN).

Figure 5:
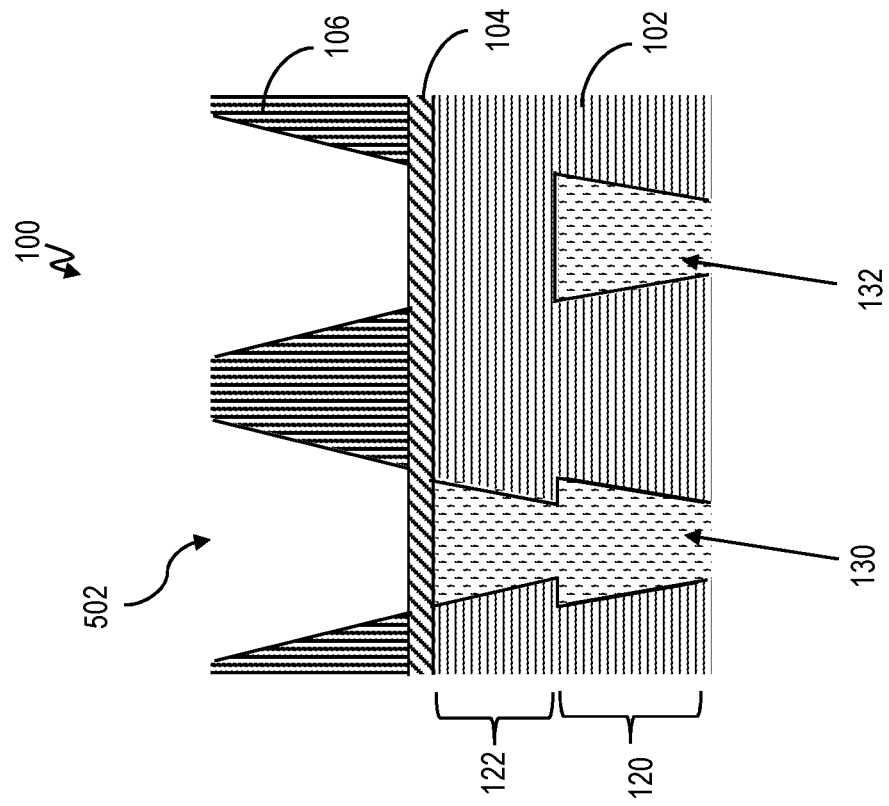

FIG. 4 depicts a cross-sectional view of the IC wafer 100 according to one or more embodiments of the invention. FIG. 4 illustrates conformal deposition of fill material 106 on top of etch stop layer 104. Openings 502 are formed in the fill material 106 above the respective conductive vias 120, as depicted in the cross-sectional view of the IC wafer 100 in FIG. 5. For example, a block mask or lithography stack can be formed on the fill material 106, and lithography is performed to form a pattern in the block mask or lithography stack. A wet etch or dry etch can be utilized to form the openings 502 in the fill material 106 according to the pattern. For example, reactive ion etching can be used to create the openings 502. The fill material 106 is selectively etched but the etching stops at etch stop layer 104 as depicted in FIG. 5. By serving as an etch stop layer, the etch stop layer 104 prevents any layers underneath, particularly layer 102, from being etched when forming openings 502. The block mask or lithography stack is removed.

Figure 6:
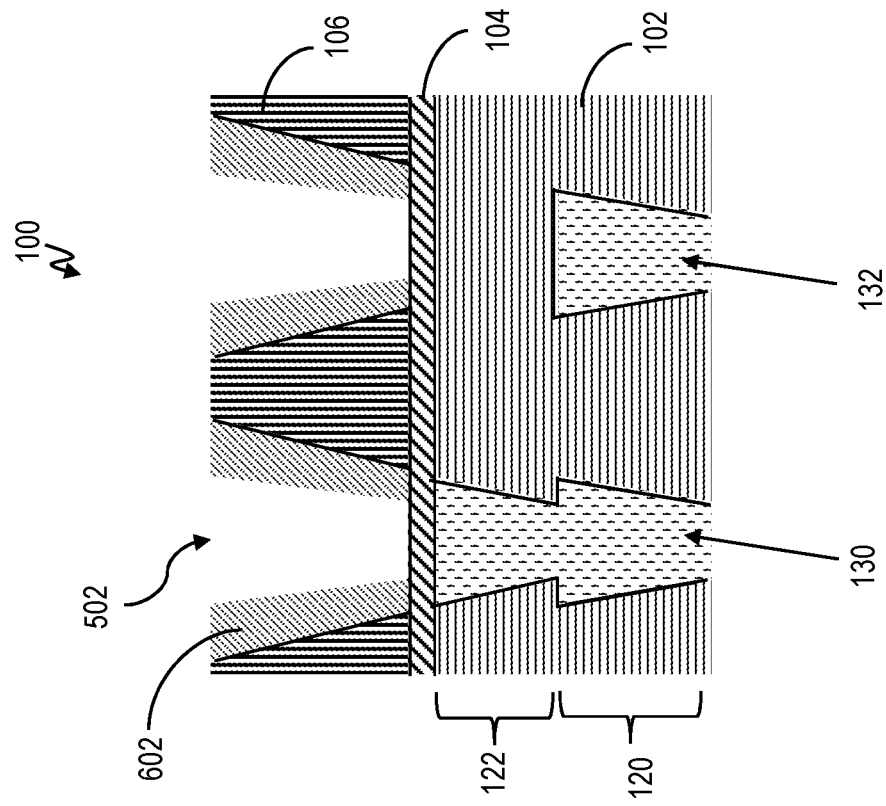

FIG. 6 depicts a cross-sectional view of the IC wafer 100 according to one or more embodiments of the invention. FIG. 6 illustrates deposition of temporary spacer material 602 on sidewalls of the openings 502 while leaving regions of etch stop layer 104 exposed in the bottom of openings 502. For example, spacer material 602 can be formed in openings 502. Lithography is performed to pattern and etch back the spacer material 602, thereby leaving exposed regions of the etch stop layer 104 immediately above the conductive via 122. Reactive ion etching (RIE) can be used to etch the spacer material 602. Example materials of the spacer material 602 can include silicon dioxide. The spacer material 602 has a different selectivity than the etch stop layer 104 such that the etch stop layer 104 can be selectively removed without etching the spacer material 602. Also, the spacer material 602 has a different selectivity than the fill material 106.

Figure 7:
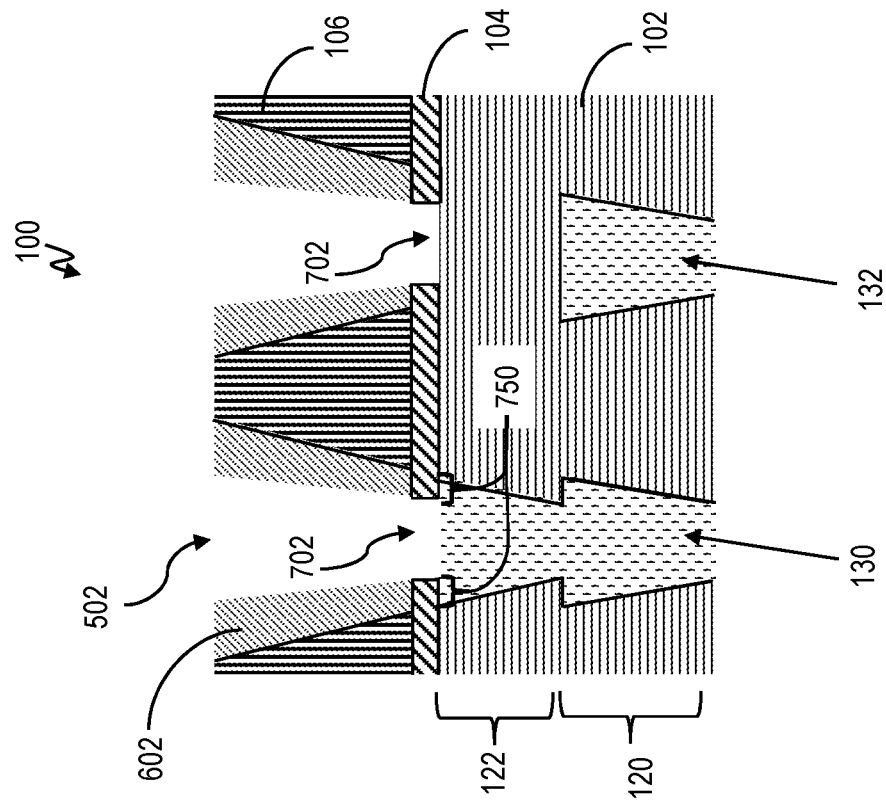

FIG. 7 depicts a cross-sectional view of the IC wafer 100 according to one or more embodiments of the invention.

FIG. 7 illustrates that etching is performed to selectively remove the exposed regions of etch stop layer 104. Reactive ion etching can be used to perform the etching. Selectively etching the exposed regions of etch stop layer 104 creates openings 702, which are to be used to form a narrowed bottom dimension of future conductive lines. FIG. 7 also shows that one of the openings 702 is aligned to conductive via 122 below, and this opening 702 exposes the top surface of conductive via 122 in preparation for metallization. The etching to form openings 702 leaves extended portions 750 of the etch stop layer 104 on one or more top surfaces of conductive via 122.

Figure 8:
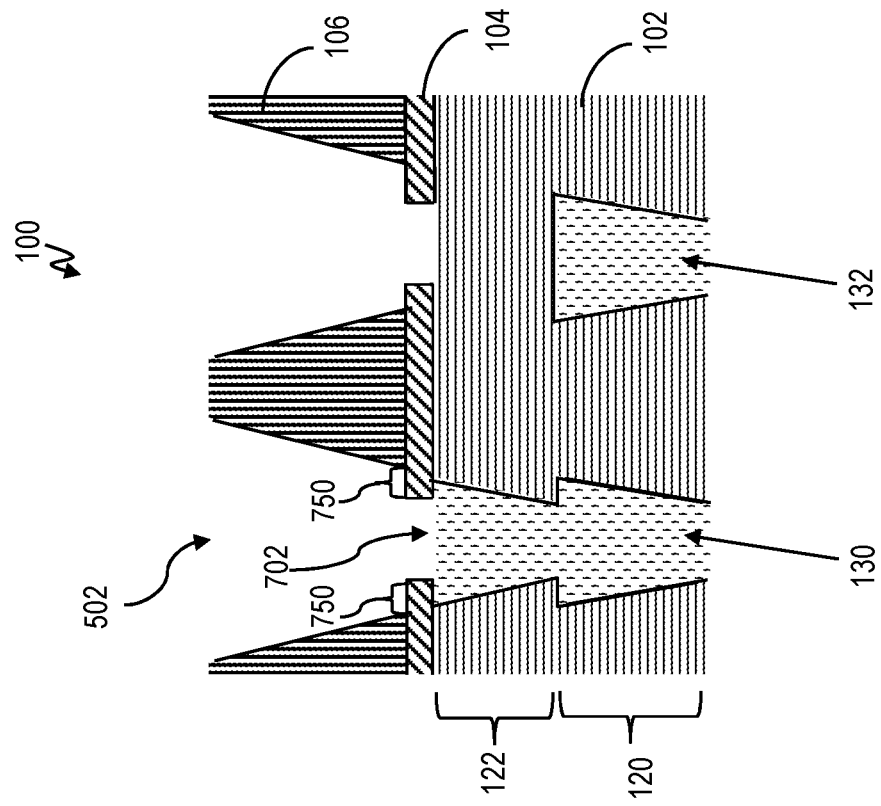

FIG. 8 depicts a cross-sectional view of the IC wafer 100 according to one or more embodiments of the invention. FIG. 8 illustrates spacer removal. Selective etching is performed to selectively remove spacer material 602 without removing the other layers. For example, a selective RIE etch can be utilized. In one or more embodiments of the invention, an example chemistry could be the following: if the dielectric material of the fill material 106 is $SiO_2$-based and the spacer material 602 is SiN-based, then $CF_4/CH_4$ chemistry can be used to etch the spacer material 602 (SiN) selective to the $SiO_2$.

As previously noted, the spacer material 602 covered and protected extended portions 750 of the etch stop layer 104 when forming openings 702 in FIG. 7. After removal of the spacer material 602, it can be seen that extended portions 750 of the etch stop layer 104 remain at their previous locations where they were protected by spacer material 602 as depicted in FIG. 8. Also, FIG. 8 shows that openings 702 are narrower than the bottom most part of openings 502, which results in the reduced line bottom dimension (or reduced CD) of the conductive line that is to be fabricated.

Figure 9:
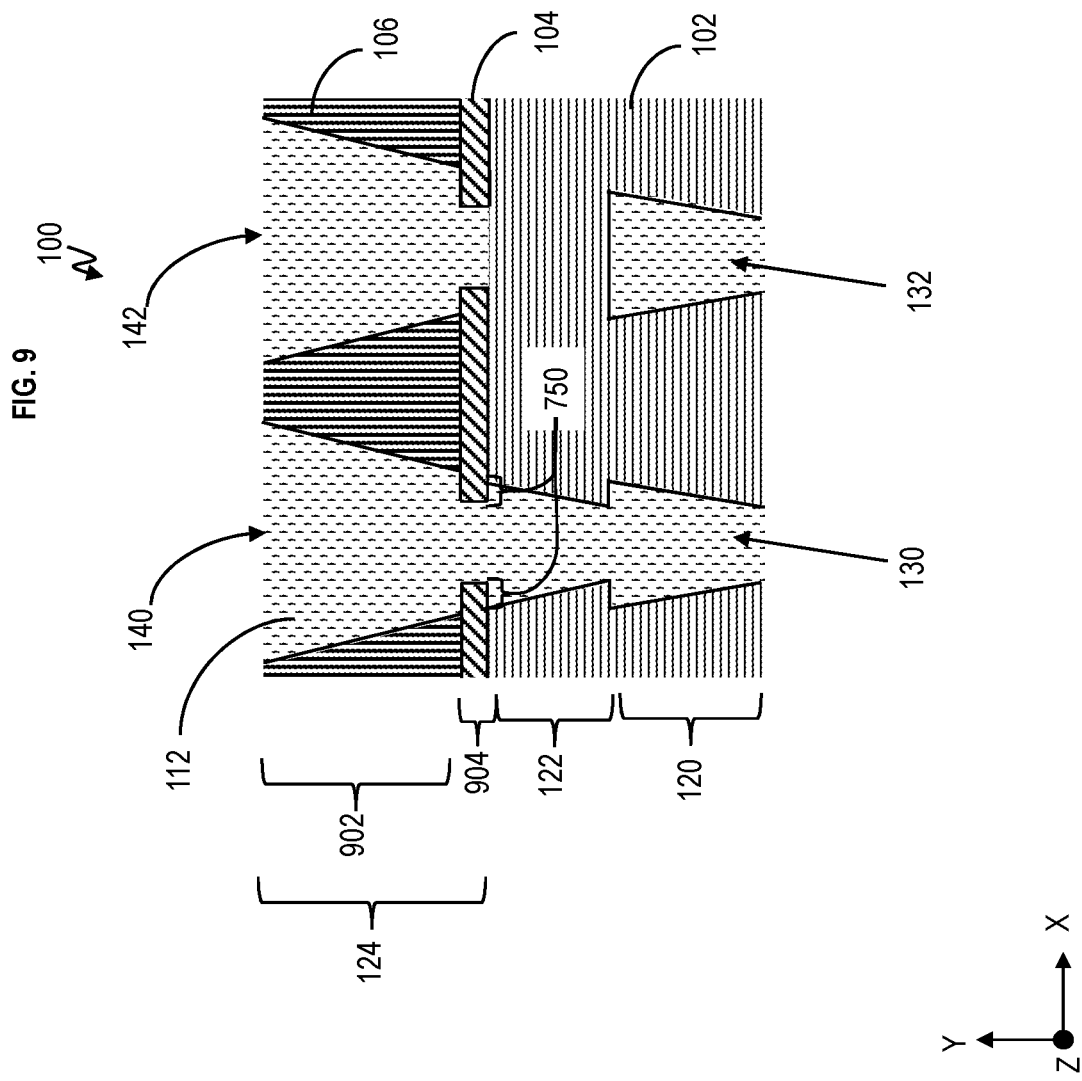

FIG. 9 illustrates metallization in which conductive material 112 is deposited in openings 502 and 702 to form conductive lines 124. Lines 124 include lines 140 and 142. By forming conductive material 112 in openings 502 and 702, each of lines 124 has a wider upper part 902 and a smaller bottom part 904. The smaller bottom part 904 has the reduced line bottom dimension (or reduced CD), for example, in the x-axis, compared to the wider upper part 902. As can be seen in FIG. 9, the smaller bottom part 904 has its width in the x-axis confined by the extended portions 750 of the etch stop layer 104. For lines 124, the wider upper part 902 sits on extended portions 750 of the etch stop layer 104, thereby separating edge portions of conductive via 122 from edge portions of the wider upper part 902.

By having the smaller bottom part 904 formed and confined by the extended portions 750 of the etch stop layer 104, the resulting bottom dimension (or CD) of the line 124 post-metallization will be smaller due to the presence of the etch stop layer 104. The smaller bottom part 904 alleviates dielectric breakdown concerns without having to change the overall lithography and/or etch procedures. This process can be applied to numerous neighboring interconnects in an integrated circuit.

FIG. 10 is a flowchart of a method 1000 of forming an IC wafer 100 according to one or more embodiments of the invention. At block 1002, the method 1000 includes forming a dielectric material (e.g., fill material 106) with an opening 502 stopping on an etch stop layer 104, the opening 502 being above a conductive via (e.g., conductive via 122). At block 1004, the method 1000 includes forming spacer material 602 in the opening to cover one or more portions (e.g., extended portions 750) of the etch stop layer 104 while permitting other portions of the etch stop layer to remain uncovered. At block 1006, the method 1000 includes removing the other portions of the etch stop layer and the spacer material 602. At block 1008, the method 1000 includes forming a conductive line (e.g., conductive line 140) on the conductive via (e.g., conductive via 122), a bottom part (e.g., bottom part 904) of the conductive line being formed through the one or more portions (e.g., extended portions 750) of the etch stop layer and having a reduced dimension.

The one or more portions of the etch stop layer 104 extend over edge portions of the conductive via (e.g., conductive via 122). The etch stop layer 104 is located on a periphery of the top surface of the conductive via 122. The etch stop layer 104 has a higher dielectric breakdown than the dielectric material (e.g., fill material 106). At least a portion of an upper part (e.g., upper part 902) of the conductive line is formed on the one or more portions (e.g., extended portions 750) of the etch stop layer 104. Another portion of the upper part (e.g., upper part 902) of the conductive line is formed on the bottom part (e.g., bottom part 904).

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit (IC) comprising:
a conductive line formed on a conductive via, the conductive line being formed though a dielectric material; and
an etch stop layer comprising one or more extended portions intervening between one or more edge portions of the conductive line and the conductive via, the one or more edge portions being at a periphery of the conductive line and the conductive via, the etch stop layer comprising a higher dielectric breakdown than the dielectric material, the one or more extended portions of the etch stop layer causing the conductive line to be formed with a bottom part having a reduced dimension than an upper part of the conductive line, a bottom surface of the upper part in direct contact with a top surface of the one or more extended portions of the etch stop layer.

2. The IC of claim 1, wherein the bottom part of the conductive line contacts the conductive via without the etch stop layer intervening.

3. The IC of claim 1, wherein the one or more extended portions are on a top surface of the conductive via.

4. The IC of claim 1, wherein the bottom part of the conductive line is conformed to a size having been shaped by the one or more extended portions.

5. The IC of claim 1, wherein the upper part is above the bottom part.

6. The IC of claim 1, wherein at least a portion of the upper part of the conductive line is formed on the one or more extended portions.

7. The IC of claim 6, wherein another portion of the upper part of the conductive line is formed on the bottom part.

8. The IC of claim 1, wherein the etch stop layer comprises a thickness ranging from about 1-4 nanometers (nm).

9. The IC of claim 1, wherein the etch stop layer comprises a thickness ranging from about 1-10 nm.

10. The IC of claim 1, wherein the etch stop layer comprises a thickness ranging from about 1-5 nm.

11. An integrated circuit (IC) comprising:
a conductive via formed in a first dielectric material;
a dielectric layer formed on the conductive via and the first dielectric material; and
a conductive line comprising an upper part and a bottom part, the dielectric layer comprising one or more extended portions intervening between one or more edge portions of the conductive line and the conductive via, the one or more edge portions being at a periphery of the conductive line and the conductive via, the dielectric layer being formed to have an opening to the conductive via, the bottom part being formed on the conductive via through the opening, the upper part being formed through a second dielectric material above the dielectric layer, a bottom surface of the upper part in direct contact with a top surface of the one or more extended portions of the dielectric layer.

12. The IC of claim 11, wherein the dielectric layer has a higher dielectric breakdown than the first and second dielectric materials.

13. The IC of claim 11, wherein the dielectric layer is formed as an etch stop layer.

14. The IC of claim 13, wherein the etch stop layer comprises a thickness ranging from about 1-4 nm.

15. The IC of claim 13, wherein the etch stop layer comprises a thickness ranging from about 1-10 nm.

16. The IC of claim 11, wherein the dielectric layer comprises the one or more extended portions on a top surface of the conductive via.

17. The IC of claim 11, wherein the opening through the dielectric layer causes the bottom part to have a smaller dimension than the upper part.

18. The IC of claim 11, wherein the opening is defined by the one or more extended portions of the dielectric layer, the bottom part of the conductive line being conformed to a size having been shaped by the one or more extended portions.

19. The IC of claim 11, wherein at least a portion of the upper part of the conductive line is formed on the one or more extended portions of the dielectric layer.

20. The IC of claim 19, wherein another portion of the upper part of the conductive line is formed on the bottom part.

* * * * *